United States Patent [19]

Lamp

[11] 4,003,621
[45] Jan. 18, 1977

[54] ELECTRICAL CONNECTOR EMPLOYING CONDUCTIVE RECTILINEAR ELEMENTS

[75] Inventor: Richard W. Lamp, Mendham, N.J.

[73] Assignee: Technical Wire Products, Inc., Cranford, N.J.

[22] Filed: June 16, 1975

[21] Appl. No.: 587,062

[52] U.S. Cl. .................. 339/59 M; 339/DIG. 3
[51] Int. Cl.² ................................ H01R 13/48
[58] Field of Search ............. 339/17, 59–61, 339/DIG. 3; 174/35 GC

[56] References Cited

UNITED STATES PATENTS

| | | | |
|---|---|---|---|
| 3,126,440 | 3/1964 | Goodloe | 174/35 GC |
| 3,324,445 | 6/1967 | Miller | 339/61 M |
| 3,542,939 | 11/1970 | Mintz | 174/35 GC |
| 3,795,037 | 3/1974 | Luttmer | 339/59 M |
| 3,795,884 | 3/1974 | Kotaka | 339/59 M |
| 3,862,790 | 1/1975 | Davies et al. | 339/17 LM |

OTHER PUBLICATIONS

IBM Bulletin, Bruder et al., July 1974, vol. 17, No. 2, pp. 638 & 639.

Primary Examiner—Joseph H. McGlynn
Attorney, Agent, or Firm—Littlepage, Quaintance, Murphy & Dobyns

[57] ABSTRACT

An electrical connector for connecting corresponding electrically conductive areas on two spaced-apart surfaces positioned on opposite sides of the connector comprises a resilient, electrically non-conductive sheet of elastomer having first and second parallel faces and a plurality of from 2,500 to 40,000 electrically conductive linear elements per square inch of area of the faces. The linear elements are distributed substantially evenly throughout the sheet of elastomer, are bonded to the elastomer, and rectilinearly extend between the two faces. Each linear element is electrically insulated from each other linear element within the elastomeric sheet while the plurality of linear elements constitutes less than 10% of the volume of the combination of linear elements and elastomeric sheet.

8 Claims, 10 Drawing Figures

ELECTRICAL CONNECTOR EMPLOYING CONDUCTIVE RECTILINEAR ELEMENTS

BACKGROUND OF THE INVENTION

1. Field of the Invention

This invention pertains generally to electrical connectors having a plurality of contacts carried by flexible resilient dielectric material and particularly to electrical connectors in which a large number of separate electrically conductive linear elements are fixed in an array between two spaced planes, each linear element having a first end in one plane and a second end in the second plane, the ends in one plane being in the same relative position and having the same relative spacing with respect to each other as their opposite ends in the other plane. The linear elements are held in the array by means of a resilient, electrically non-conductive elastomer such that a large number of small diametered electrically conductive linear elements are spaced in accurate alignment with each other through a sheet or plate of the dielectric elastomer. The connectors provided by this invention are adapted for picking up electrical charges and small currents from selected points in one plane and conducting them to corresponding points in another plane.

2. Description of the Prior Art

Numerous electrical connector devices have been proposed in the prior art utilizing a large number of wires extending generally through a body of elastomeric insulating material, the wires extending between spaced surfaces parts of the elastomer generally through non-rectilinear paths. Such connectors generally required a wire of metal having good spring characteristics as well as satisfactory electrical performance and resistance to chemical degradation to ensure satisfactoy electrical conductivity between the two surfaces of the connector. The wires were typically made of phosphor bronze, brass, Monel, copper, stainless steel, and other metals having inherent spring-like properties and of sufficient hardness to pierce any oxide coating which might be present on the electrical conductors sought to be connected by the connector. The prior art failed to appreciate that the necessary forces for elastic recovery of the wires might be found in the elastomeric body rather than the wire.

The cross-sectional dimension of the linear conductive elements and the spacing between adjacent elements are two variables which have been previously considered as subject only to the designer's choice, depending on the number of exposed wires per unit surface area of the connector sought by the designer. Close packing of the elements has been considered optimum by much of the prior art. Surprisingly, it has been found that if the plurality of the electrically conductive linear elements constitutes much in excess of 10% of the volume of the connector, the connector behaves less as cushioning elastomer and more like an inflexible, incompressible solid.

The prior art has generally assumed that a disadvantage was to be experienced when a connector contained electrically conductive linear elements rectilinearly extending normally from one face of the connector to a second parallel face of the same connector. In general, the electrically conductive elements of the prior art embedded in a matrix of elastomeric material were corrugated, angularly bent, arcuately curved, or in some other manner extended through the elastomeric matrix in non-rectilinear paths. Known instances of linear elements rectilinearly extending through a matrix of dielectric material required that the matrix be a non-elastomeric, hardened solid block of material such as glass.

None of the prior art considered the difference of behavior of electrically conductive linear elements which can be considered slender columns rather than compression blocks. When subjected to a compressional load along the axis, a slender column tends to experience an elastic buckling behavior rather than a simple compression. The behavior is, as the name implies, elastic in nature and is not permanently deforming. By designing the electrically conductive linear elements in a connector to fit the slender column criteria, it is no longer necessary to artificially introduce curves, bends, corrugations, or the like, to ensure elastic deflection under a compressional load.

The prior art has also failed to consider the advantages to be experienced with electrically conductive linear elements which are not wholly metallic. Particularly advantageous features are to be found in the use of electrically conductive linear elements of foil wrapped textile strands, metal-plated resin monofilaments, carbon-loaded nylon and other carbon yarns. Examples of the prior art may be found in U.S. Pat. Nos. 2,885,459; 3,126,440; 3,542,939; 3,714,706; 3,795,037; 3,862,790; and 3,852,878. Other prior art which may be of interest can be found discussed in these patents.

SUMMARY OF THE INVENTION

One aspect of the invention provides means for interconnecting electrically conductive areas of a first of at least two spaced-apart surfaces with corresponding electrically conductive areas of a second of the at least two surfaces. The means comprises a combination of a resilient, electrically non-conductive sheet of elastomer having a first face and a second face parallel to each other. The means further comprises a plurality of from 2,500 to 40,000 electrically conductive linear elements per square inch of area of either of the faces, the linear elements being distributed substantially evenly throughout the sheet of elastomer and bonded to the elastomer. The linear elements rectilinearly extend normally from the first face to the second face, each linear element being electrically insulated from every other linear element within the sheet. The plurality of linear elements constitute less than 10% of the volume of the combination.

One feature of the invention is the incorporation of electrically conductive linear elements which are not wholly metal. Particular advantages are to be found with electrically conductive linear elements of foil wrapped textiles and metal-plated resin monofilaments.

Elastomers which can be satisfactorily used in a connector according to this invention include copolymers of butadiene-styrene, butadiene-acrylonitrile, and butadiene-isobutylene as well as chloroprene polymers, polysulfide polymers, plasticized vinyl chloride and vinyl acetate polymers and copolymers, polyurethanes and silicone rubbers having a renitence less than 80 durometer Shore A. The silicone rubbers conventionally are dimethyl, methyl-phenyl, methyl-vinyl, or the halogenated siloxanes that are mixed with fillers such as a silica to impart proper rheology and vulcanized or cured with peroxides or metal salts. Silicone rubber is generally preferred because of its aging characteristics and its retention of physical characteristics at temperature extremes. The elastomers used should be form stable; that is, they should not deform unduly under their own weight, nor should they plastically deform after curing.

The resilient character of the elastomers involved assures a good electrical connection between the electrically conductive linear elements and the conductors sought to be connected by elastically deforming in response to external forces. This effects a vibrational absorbing and cushioning not available from undamped flexible metal connectors. This damped flexible supporting of the surface of the connector also hermetically seals the conductor surface after contact has been made thereby inhibiting corrosion by preventing the migration of hostile environments to the contacting conductor surface. While the deformation of the linear elements is believed in most situations to be elastic, the major restoring force is to be found in the elastomeric body not the material forming the linear elements. That is, the restoring character of the elastomer is generally superior to that of the linear elements.

One advantage of the connecting means according to this invention is the freedom to select partially non-metallic linear elements, particularly since the compressional elasticity of the elastomer forming the non-conductive sheet contributes substantially to the elastic recovery of the slender columnlike linear element. This is particularly true since a strong bond is maintained between the linear elements and the elastomeric sheet. The combination of a strong bond formed between the elastomer and the elements, and the fact that the elements are linear rather than convoluted or corrugated, permits connectors of any thickness to be made which will have the desired features of this invention.

In making a connector according to this invention a block of elastomer is formed using techniques shown generally in the prior art with the appropriate volume density and arraignment of linear elements extending linearly through the block. The block can then be repeatedly cut in planes substantially perpendicular to the linear elements within the block, thereby forming sheets of elastomer having a first and a second face parallel to each other and a plurality of from 2,500 to 40,000 electrically conductive linear elements per square inch of area of the face extending through the sheet from the first face to the second face.

Particularly important is the presence of a surface coating on the linear elements ensuring a strong, stable bond between the linear elements and the elastomer. When silicone elastomers are used, coatings of modified polyester, an example of which is heavy Polythermalize, have been found to be satisfactory. Where the linear elements are other than solid metal, the surface coatings have been found to be no longer necessary, but still desirable. The presence of the surface coating to ensure the strong bond between the elastomer and the linear elements ensures the elastomer will contribute to restoring any deformed element to its original position.

Other features and advantages of the several aspects of this invention will become apparent to those of ordinary skill in the art from the following discussion of some preferred embodiments, together with the accompanying figures and appended claims.

DESCRIPTION OF THE PREFERRED EMBODIMENTS

Figure 1:
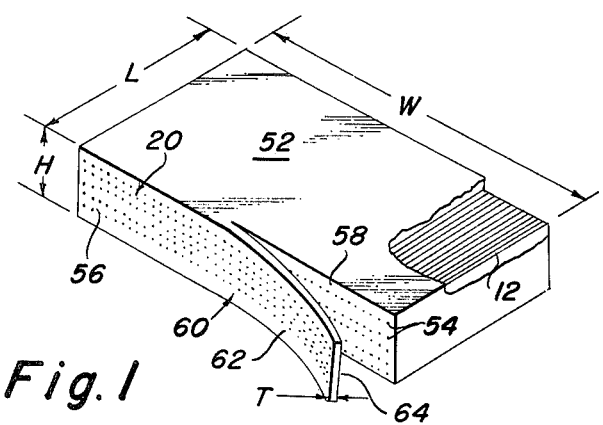
FIG. 1 is a perspective view of a block of elastomer having a plurality of electrically conductive linear elements extending through the block, parallel to one another and bonded to the elastomer.

A block 52, shown in perspective in FIG. 1, has a plurality of electrically conductive linear elements 12 extending through the block parallel to one another and bonded to the elastomer 20 forming the block 52. The linear elements 12 can be viewed as existing in a plurality of layers 54 within the block 52, each layer of linear elements being separated from the next adjacent layer of linear elements by a distance equal to the height of the blocks H divided by the number of layers $n$. The value of this dimension $H/n$ agrees favorably with the density of linear elements 12 in any particular layer 54 within block 52 in the direction W. Preferably, the density of linear elements 12 in any single layer 54 is between 50 and 200 linear elements per inch in the dimension W, while the dimension $H/n$ preferably ranges between 1/50 and 1/200 of an inch respectively. This results in a density of from 2,500 to 40,000 electrically conductive linear elements per square inch of area of face 56 of block 52.

Figure 2:
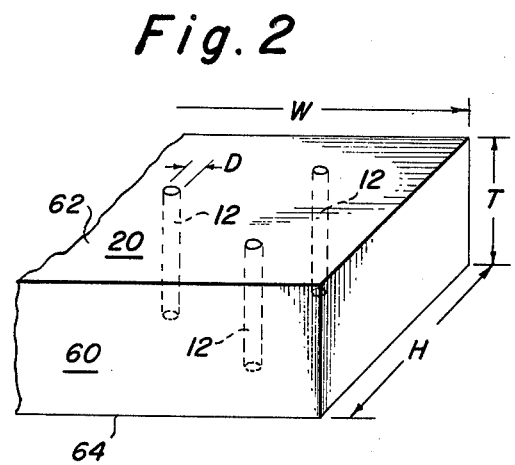
FIG. 2 is a detailed perspective view of a thin sheet of elastomer cut from the block of FIG. 1.

The block 52 is then repeatedly cut in planes 58 which are substantially perpendicular to the linear elements 12 within the block 52. With each cut is formed a sheet 60 of elastomer 20 having first and second parallel faces 62 and 64, respectively. The two faces 62 and 64 are separated from each other by a thickness T which is subject to some constraints discussed herein. The sheet 60, shown greatly enlarged in FIG. 2, further comprises a plurality of from 2,500 to 40,000 electrically conductive linear elements 12 per square inch of area of the face 62 or 64, extending through the sheet 60 of elastomer 20. The linear elements 12 are distributed substantially evenly throughout the sheet 60 and are strongly bonded to the elastomer 20. The linear elements 12 rectilinearly extend normally from the first face 62 to the second face 64. The linear elements 12 are typically circular in cross section, having a diameter D. While the cross sectional shape of the linear elements is largely a matter of choice of design, the composition and dimensions of the linear elements 12 are subject to some constraints hereinafter discussed. In general, where the linear elements 12 consist of solely a metal, the linear elements 12 constitute less than 10% and preferably less than 4% of the volume of the sheet 60.

Figures 3, 4, 5:
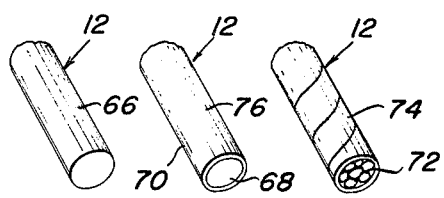
FIGS. 3, 4 and 5 are detailed illustrations of alternative embodiments of linear elements to be included in a connector according to this invention.
Figures 6, 7:
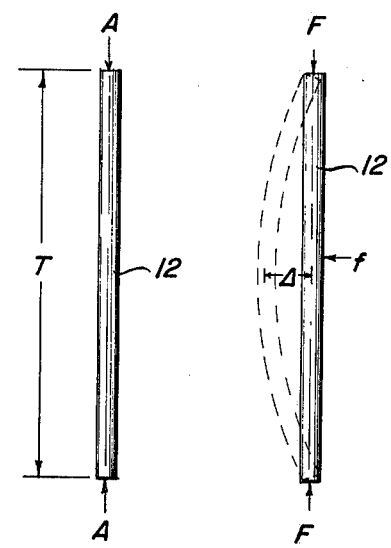
FIG. 6 is a schematic representation of a linear element having the dimensions of a slender column.
FIG. 7 is a further schematic representation of the linear element of FIG. 6 when subjected to an axial compressive force F.

The linear elements 12 can comprise any of three embodiments shown generally in FIGS. 3, 4 and 5. In a first embodiment shown in FIG. 3, the linear element 12 can be a solid metal element 66, preferably having a Young's Modulus, E, less than $20 \times 10^6$ pounds per square inch. A solid metal element 66 would also preferably have a slenderness ratio greater than about 5. The slenderness ratio of any linear element can be determined by considering the length of the element T as shown in FIG. 6 and comparing it to the radius of gyration $r$ of the linear element about the longitudinal axis A. The slenderness ratio is then equal to $T/r$. The strength of the linear element 12 in the longitudinal direction has been found to be in a first approximation inversely proportional to the square of the slenderness ratio and directly proportional to the stiffness of the material from which the linear element is made as measured generally by Young's Modulus. In a preferred embodiment, the dimensions of a linear element included in a connector according to this invention should be selected such that: $T/r \geq 10^{-2}(E)^{.54}$.

Other embodiments of the linear element 12 can be a resin monofilament 68 which is metal plated to render the outside surface 20 electrically conductive as shown in FIG. 4 or one or more textile strands 72 helically wrapped with a metal foil 74, as shown in FIG. 5. An example of a linear element having the structure shown in FIG. 5 is the family of bare tinsel conductors satisfying Navy Specification 15C9 Type F.T. & F.T.P. and particularly Type T-3082 available from the Montgomery Company of Windsor Lock, Connecticut. An example of a linear element having the structure shown in FIG. 4 is a silver plated nylon monofilament. The nylon can be carbon loaded or another conventional carbon monofilament can be substituted for the nylon. While with solid metal linear elements 66, the slenderness ratio establishes a more important criteria, with the plated monofilament 68 or the foil wrapped textile strands 72, the more important criteria is established by the stiffness of the resin 68 and metal foil 74, respectively. Typically, the stiffness of the metal plating 76 can largely be disregarded and one need only consider the stiffness of the resin monofilament 68. In compression, the stiffness of resins such as nylon, polyvinylchloride, and other resins typically used in this environment, is at least an order of magnitude less than that of even the softest of metals.

Figure 8:
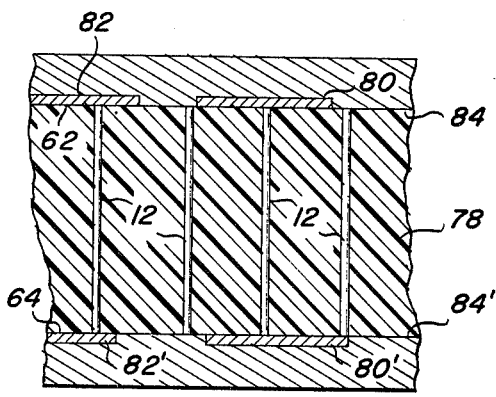
FIG. 8 is a sectional view of a connector according to this invention positioned between two spaced-apart surfaces having corresponding electrically conductive areas.

The stiffness of the metal foil 74 can contribute a substantial portion to the strength of the foil-wrapped textile strands 72. Since the metal foil 74 is helically wound around the textile strands 72, it behaves to some degree as a coiled compression spring as well as a laterally deflected longitudinal member as shown in FIG. 7. Any linear element 12, when subjected to a longitudinal force of compression F and a small deflecting force $f$ elastically deflects through a deviation $\Delta$ so long as the force F is applied. In a connector 78 according to this invention as shown in FIG. 8, a plurality of linear elements 12 extend between opposite faces 62 and 64 of the connector 78. The electrically conductive linear elements 12 extend between and electrically connect corresponding electrically conductive areas 80, 80' and 82, 82', respectively fixed to two spaced apart surfaces 84 and 84'. Under even very slight compression, the elastomer 20 of the connector 78 exerts sufficient deflecting forces $f$ which can be random in direction as to cause the linear element to deflect and thus elastically compress. While the deformation of the linear elements is believed in most situations to be elastic, the major restoring force is to be found in the elastomer 20 and not in the linear elements.

Figure 9:
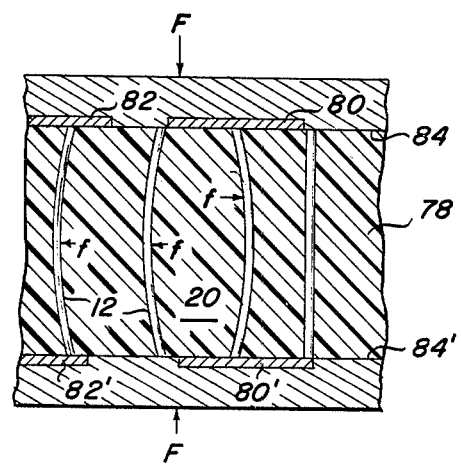
FIG. 9 is the same sectional view as that of FIG. 8, when the connector is subjected to face-to-face compression.

It is necessary that the linear elements be permitted to deflect as shown in FIG. 7. This requires that the linear elements constitute only a small portion of the volume of the connector. Since the foil-wrapped linear elements 74 behave to some degree as a coiled spring, a connector 78 can comprise up to 20% by volume of the foil-wrapped elements 74. The resin monofilament elements 68 can be present in an amount up to about 15% by volume while the solid metal elements 66 can only be present in an amount less than 10% by volume. When the force F shown in FIG. 9 is released, the elastomer 20 contributes substantially to the elastic recovery of the linear elements 12 to their initial position as shown in FIG. 8, since the linear elements 12 are bonded well to the elastomer 20. The incorporation of too many linear elements by volume results in the hardening of the connector to a point that the small lateral deflection $\Delta$ can no longer be experienced by the linear elements, thus resulting in unsatisfactory performance. The low volume concentration of linear elements assures that the restoring character of the elastomer is superior to any tendency for permanent inelastic deformation of the linear elements.

Figure 10:
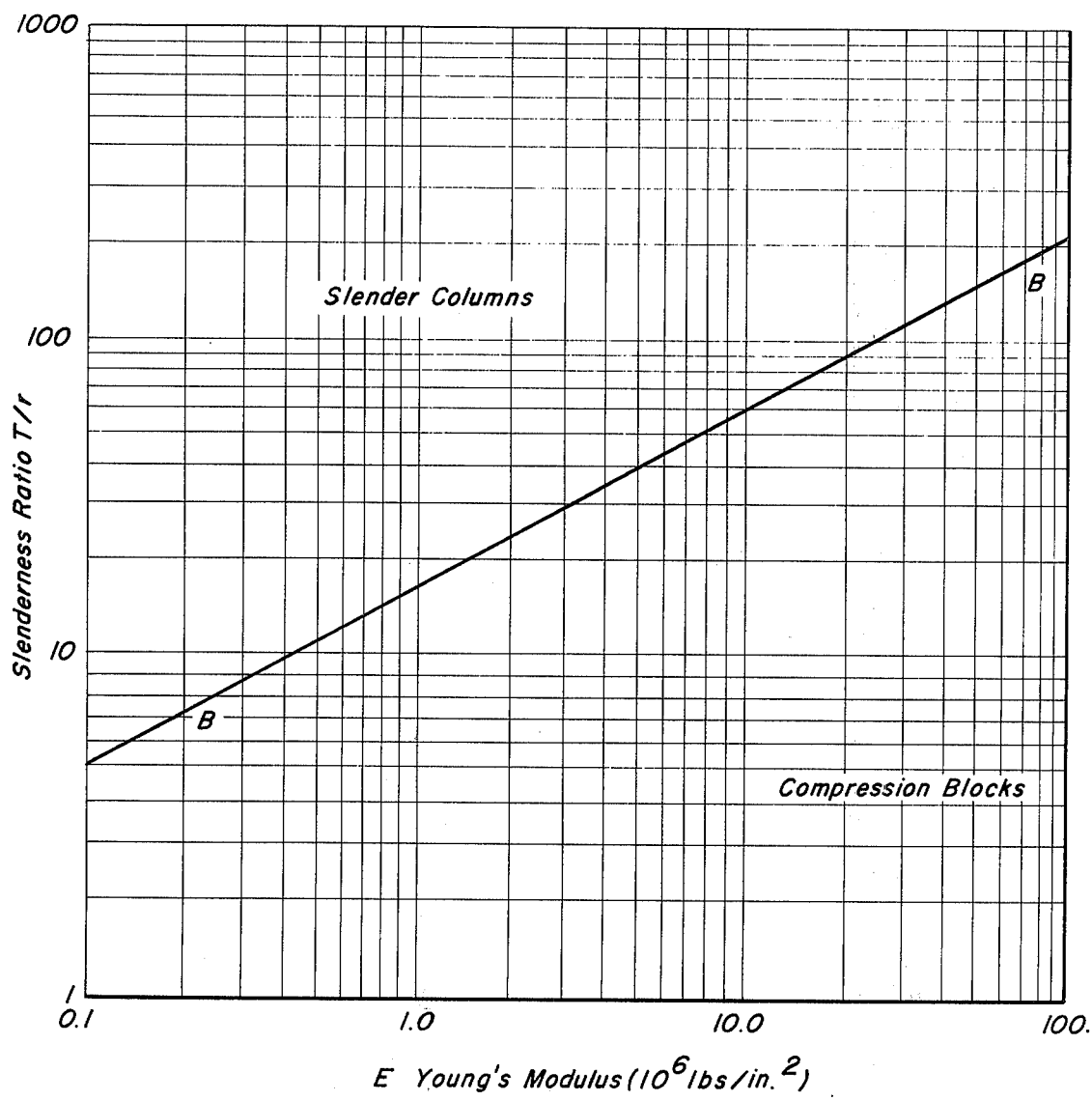
FIG. 10 is a graph showing the relationship between the slenderness ratio of a linear element and the Young's Modulus of the material forming that linear element, thereby defining that class of linear elements considered by the applicants to be "slender columns".

In FIG. 10, the slenderness ratio $T/r$ is related to the stiffness of a material as measured by Young's Modulus. In order that an element exhibit the most desired properties, it has been found that is must have a slenderness ratio and stiffness which will place it above the diagonal line B-B. This line is given approximately by $T/r = 10^{-2}(E)^{.54}$ where E is measured in pounds per square inch. Regardless of the stiffness, however, the desired behavior is difficult to achieve when $T/r$ is less than 5. Any connector according to this invention tends to become undesirably large when $T/r$ is greater than 1000.

Although the invention has been described in considerable detail with reference to certain preferred embodiments thereof, it will be understood that variations and modifications can be effected within the spirit and scope of the invention as described above and as defined in the appended claims.

What is claimed is:

1. Means for interconnecting electrically conductive areas of a first of at least two spaced-apart surfaces with corresponding electrically conductive areas of a second of the at least two spaced-apart surfaces comprising a combination of
    a resilient, electrically non-conductive sheet of elastomer having a first face and a second face substantially parallel to the first face, and
    a plurality of from 2,500 to 40,000 electrically conductive linear elements, the linear elements being distributed substantially evenly throughout said sheet of elastomer and bonded to the elastomer, the linear elements rectilinearly extending from the first face to the second face, the linear elements each being a foil-wrapped textile strand.

2. Means for interconnecting electrically conductive areas of a first of at least two spaced-apart surfaces with corresponding electrically conductive areas of a second of the at least two spaced-apart surfaces comprising a combination of
- a resilient, electrically non-conductive sheet of elastomer having a first face and a second face substantially parallel to the first face, and
- a plurality of from 2,500 to 40,000 electrically conductive linear elements, the linear elements being distributed substantially evenly throughout said sheet of elastomer and bonded to the elastomer, the linear elements rectilinearly extending from the first face to the second face, the linear elements each being a metal-plated resin monofilament.

3. Means for interconnecting electrically conductive areas of a first of at least two spaced-apart surfaces with corresponding electrically conductive areas of a second of the at least two spaced-apart surfaces comprising a combination of
- a resilient, electrically non-conductive sheet of elastomer having a first face and a second face substantially parallel to the first face, and
- a plurality of conductive linear elements, the linear elements being distributed substantially evenly throughout said sheet of elastomer and bonded to the elastomer, the linear elements rectilinearly extending from the first face to the second face and constituting less than 20% of the volume of said combination, the linear elements each being a metal-plated carbon-loaded nylon monofilament.

4. Means for interconnecting electrically conductive areas of a first of at least two spaced-apart surfaces with corresponding electrically conductive areas of the second of at least two spaced-apart surfaces comprising a combination of
- a resilient, electrically non-conductive sheet of elastomer having a first face and a second face substantially parallel to the first face, and
- a plurality of electrically conductive linear elements, the linear elements each comprising a metal covered non-metallic strand, the linear elements being distributed substantially evenly throughout said sheet of elastomer and bonded to the elastomer, the linear elements extending from the first face to the second face.

5. The means of claim 4 wherein said linear elements are each a foil-wrapped textile strand.

6. The means of claim 4 wherein said linear elements are each a metal-plated resin on a filament.

7. The means of claim 6 wherein said linear elements are each a metal-plated carbon-loaded nylon monofilament.

8. Means for interconnecting electrically conductive areas of a first of at least two spaced-apart surfaces with corresponding electrically conductive areas of a second of the at least two surfaces comprising the combination of
- a resilient, electrically non-conductive sheet of elastomer having a reintence less than 65 durometer Shore A and having a first face and a second face substantially parallel to the first face, and
- a plurality of from 2,500 to 40,000 electrically conductive linear elements per square inch of area of either of said faces, the electrically conductive linear elements being distributed substantially evenly throughout said sheet of elastomer and bonded to the elastomer such that each linear element is electrically insulated from every other linear element within the sheet, the linear elements rectilinearly extending from said first face to said second face, the plurality of linear elements constituting less than 20% of the volume of said combination, each of the electrically conductive linear elements comprising a metal covered nonmetallic strand.

* * * * *

UNITED STATES PATENT AND TRADEMARK OFFICE
CERTIFICATE OF CORRECTION

PATENT NO. : 4,003,621
DATED : January 18, 1977
INVENTOR(S) : Richard W. Lamp

It is certified that error appears in the above—identified patent and that said Letters Patent are hereby corrected as shown below:

Claim 1, line 10 and Claim 2, line 10, after "elements" (first occurrence) insert --per square inch of area of either of said faces--.
Claim 8, line 7, "reintence" should be --renitence--.
Column 3, line 41, "arraignment" should be --arrangement--.
Column 5, line 31, "20" should be --70--.

Signed and Sealed this fifth Day of July 1977

[SEAL]

Attest:

RUTH C. MASON
Attesting Officer

C. MARSHALL DANN
Commissioner of Patents and Trademarks